United States Patent [19]

Tanimura et al.

[11] Patent Number: 4,660,180

[45] Date of Patent: Apr. 21, 1987

[54] SEMICONDUCTOR MEMORY DEVICE INCLUDING AN IMPROVED DATA REFRESHING ARRANGEMENT AND A SYSTEM EMPLOYING THE SAME

[75] Inventors: Nobuyoshi Tanimura, Musashino; Hiroshi Kawamoto, Kodaira, both of Japan

[73] Assignee: Hitachi, Ltd., Tokyo, Japan

[21] Appl. No.: 658,910

[22] Filed: Oct. 9, 1984

[30] Foreign Application Priority Data

Oct. 7, 1983 [JP] Japan ............................. 58-186707

[51] Int. Cl.[4] ........................ G11C 7/00; G11C 8/00
[52] U.S. Cl. ................................. 365/222; 365/189; 365/230
[58] Field of Search ..................... 365/222, 230, 189

[56] References Cited

U.S. PATENT DOCUMENTS

| | | | |
|---|---|---|---|
| 3,811,117 | 5/1974 | Anderson, Jr. et al. | 365/222 |
| 4,412,313 | 10/1983 | Ackland et al. | 365/205 |
| 4,472,792 | 9/1984 | Shimohigashi et al. | 365/230 |

Primary Examiner—James W. Moffitt
Attorney, Agent, or Firm—Antonelli, Terry & Wands

[57] ABSTRACT

The dynamic RAM has a refresh circuit with two operation modes. In the first operation mode, a variety of signals necessary for the refresh operation are formed in the dynamic RAM. Accordingly, the refresh operation of the dynamic RAM is performed completely automatically. As long as the refresh operation is being carried out, a busy signal is produced from the dynamic RAM to prevent an erroneous writing operation or reading operation. In the second operation mode, the refresh operation of the dynamic RAM is performed in synchronism with a starting signal supplied from an external unit. The busy signal produced by the dynamic RAM that is working under the first operation mode can be used as a starting signal for the dynamic RAM that is working under the second operation mode. Therefore, the refresh operation is effected in synchronism for the dynamic RAM's that constitute the memory system, and the through-put of the memory system is enhanced.

16 Claims, 5 Drawing Figures

SEMICONDUCTOR MEMORY DEVICE INCLUDING AN IMPROVED DATA REFRESHING ARRANGEMENT AND A SYSTEM EMPLOYING THE SAME

BACKGROUND OF THE INVENTION

The present invention relates to a semiconductor memory device and a system employing the same, and particularly to a dynamic random access memory (hereinafter referred to as dynamic RAM) and a system employing the same.

The dynamic RAM has a plurality of dynamic memory cells each consisting of a memory capacitor which stores data in the form of electric charge and an insulated gate field effect transistor (hereinafter referred to as MOSFET) which selects address. In the dynamic memory cell formed on a semiconductor substrate, the electric charge built up in the memory capacitor decreases with the lapse of time due to a leakage current. To store the correct data in the memory cells at all times, therefore, it is necessary to perform a so-called refresh operation according to which the data stored in the memory cells is read out before it extinguishes, the data is amplified and is written again onto the same memory cells.

For instance, the memory cells in a 64-kilobit dynamic RAM are refreshed by a refresh function which is disclosed in a journal "Denshi Gijutsu", Vol. 23, No. 3, Mar. 1, 1981 pp. 30-33. That is, the dynamic RAM is provided with an automatic refresh function which automatically refreshes a plurality of memory cells in the dynamic RAM by applying a refresh signal having a predetermined level to external terminals for refresh control, and is further provided with a self refresh function which performs the refresh operation every time a predetermined period of time has passed by maintaining the external refresh signal at a predetermined level to actuate a built-in timer circuit. This refresh system requires the external refresh signal and, hence, is not capable of performing a completely automatic refresh operation.

Another possible approach is to perform the self refresh operation every time a predetermined period of time set by a built-in timer circuit has passed. However, the inventors of the present invention have found that the above method develops a problem as described below. That is, in the case of a memory system consisting of a plurality of dynamic RAM's, the individual dynamic RAM's perform the refresh operation independently of each other. Therefore, through-put of the memory system decreases strikingly.

SUMMARY OF THE INVENTION

An object of the present invention is to provide a semiconductor memory device which can be easily operated.

Another object of the present invention is to provide a system which is designed to increase the through-put.

The above and other objects, as well as novel features of the present invention will become obvious from the description of the specification and the accompanying drawings.

DESCRIPTION OF THE PREFERRED EMBODIMENTS

Figure 1:
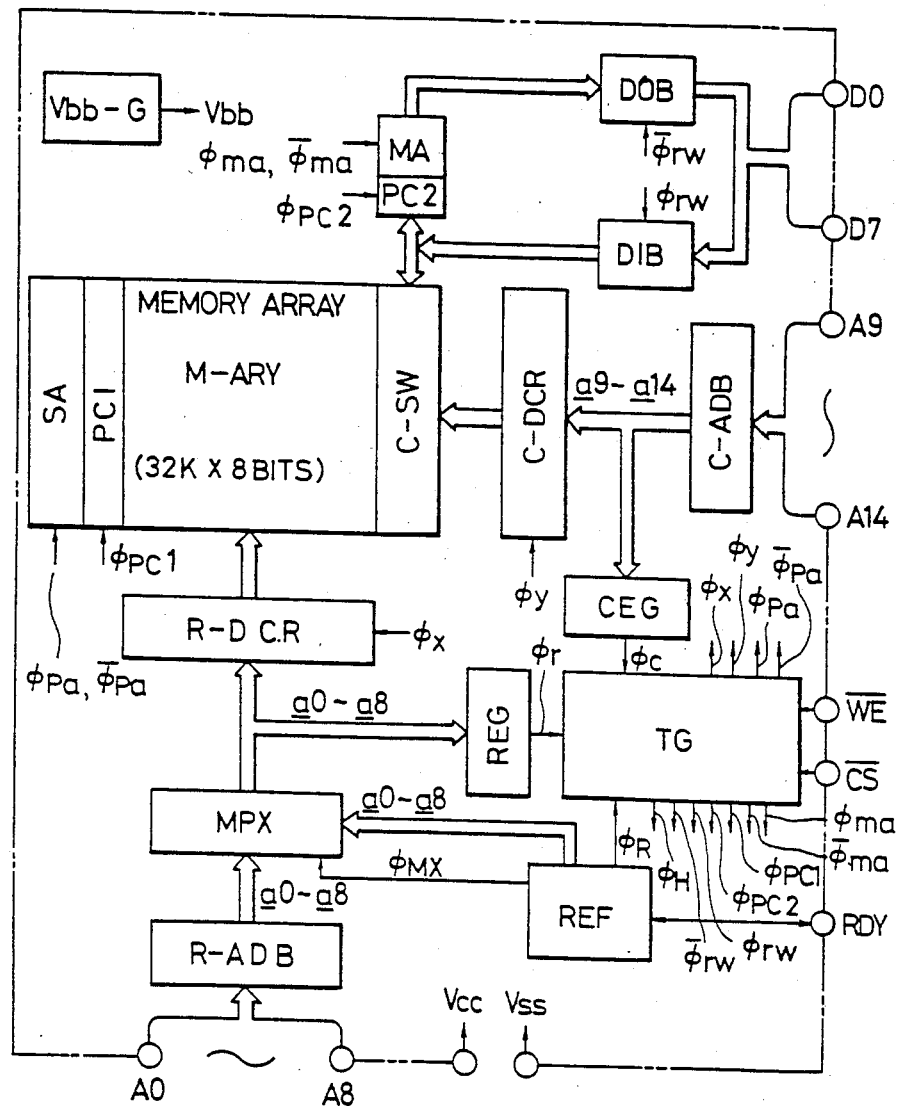
FIG. 1 is a block diagram showing a dynamic RAM according to an embodiment of the present invention.

FIG. 1 is a block diagram showing a dynamic RAM according to an embodiment of the present invention. In FIG. 1, each circuit block surrounded by a dotted line is formed on a semiconductor substrate such as of single crystalline silicon by a known technique for manufacturing CMOS (complementary metal oxide semiconductor) integrated circuits. In FIG. 1, furthermore, symbols D0 to D7, A0 to A14, $\overline{WE}$, $\overline{CS}$, RDY, $V_{cc}$ and $V_{ss}$ denote external terminals. A power-source voltage is applied to the external terminals $V_{cc}$ and $V_{ss}$ from an external power source that is not shown.

Symbol M-ARY denotes a memory array consisting of known dynamic memory cells that are arranged in the form of a matrix. Each memory cell consists of a MOSFET and a capacitor. Although there is no particular limitation in this embodiment, the memory array used is preferably a folded bit line system. In the memory array of the folded bit line construction, the input/output nodes of the individual memory cells are coupled to either one of a pair of complementary data lines D, $\overline{D}$ that are arranged in parallel with each other on the semiconductor substrate.

Symbol PC1 denotes a precharge circuit for precharging the data lines. The precharge circuit PC1 consists of a MOSFET which receives a precharge signal $\phi_{pc1}$ and which, though not specifically limited, short-circuits the pair of complementary data lines D, $\overline{D}$ to precharge them to $V_{cc}/2$.

Figure 4:
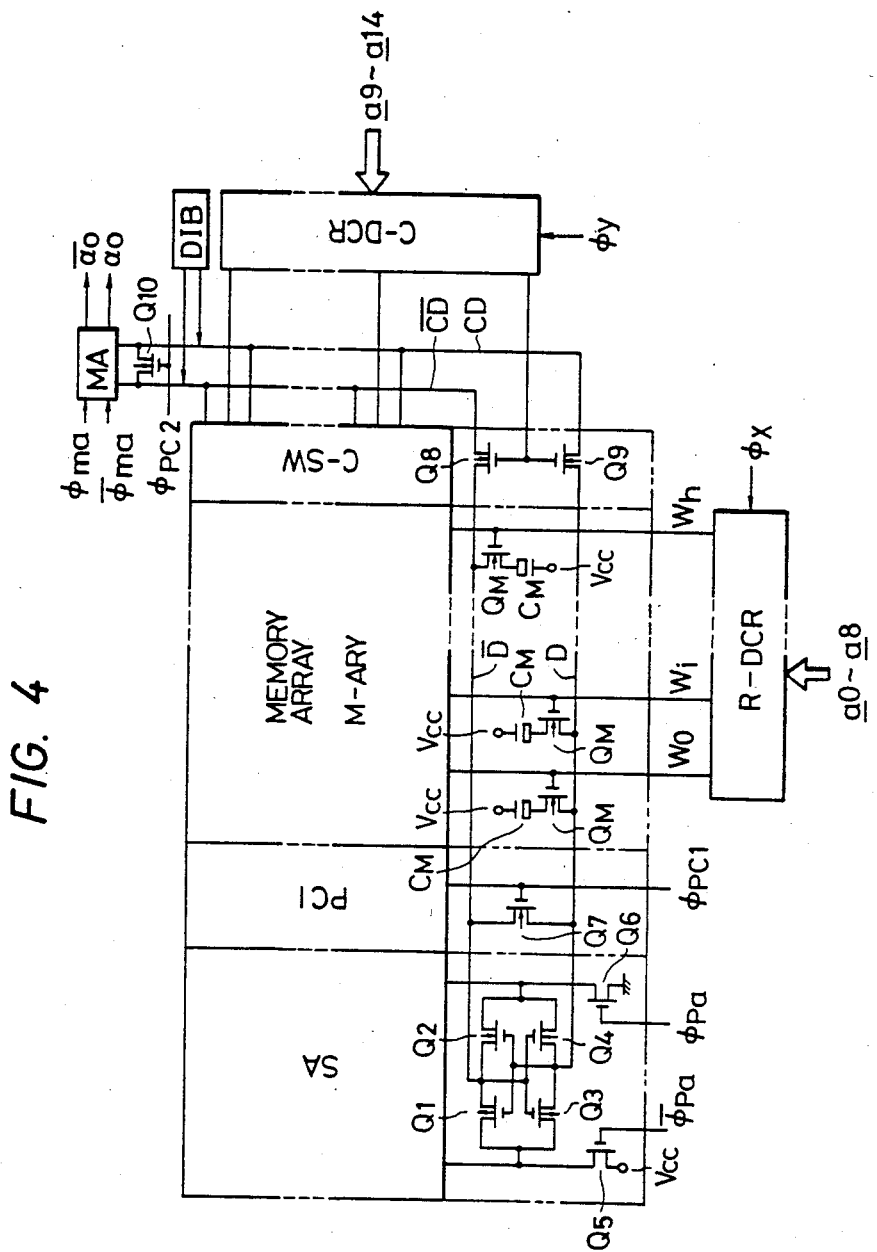
FIG. 4 is a circuit diagram of a memory array (M-ARY) of FIG. 1 according to the embodiment.

Symbol SA denotes a sense amplifier which consists of a plurality of unit sense amplifier circuits each being composed of a CMOS latch circuit, and power-switching MOSFET's provided between the power-source voltage $V_{cc}$ and the ground potential $V_{ss}$ in each of the unit sense amplifier circuits (e.g. see FIG. 4). The pair of input and output nodes of the unit sense amplifier circuits are coupled to the corresponding complementary data lines D, $\overline{D}$ (shown in FIG. 4). The power-switching MOSFET's connected between the power-source voltage and the ground potential work substantially simultaneously to effect on/off operation responsive to timing signals $\phi_{pa}$, $\overline{\phi}_{pa}$. The power-switching MOSFET's are turned off just prior to precharging the complementary data lines. This enables the complementary data lines D, $\overline{D}$ to maintain the $V_{cc}$ and $V_{ss}$ levels under the floating condition. Then, the precharging MOSFET constituting the precharge circuit PC1 is turned on. The complementary data lines are then precharged to a potential nearly equal to $V_{cc}/2$.

Symbol C-SW denotes a column switch which couples only those complementary data lines to be selected, to common complementary data lines, responsive to column selection signals supplied from a column address decoder C-DCR.

Symbol R-ADB denotes a row address buffer which receives external address signals via external terminals A0 to A8 to form internal complementary address signals a0 to a8.

In this specification, an internal address signal a0 which is substantially in phase with an external address signal supplied via the external terminal A0, and an internal address signal $\overline{a0}$ which is substantially in opposite phase with respect to the above external address signal, are expressed as internal complementary address signals a0. The same also holds true for other internal complementary address signals a1 to a8.

Symbol C-ADB denotes a column address buffer which receives external address signals via external terminals A9 to A14 to form internal complementary address signals a9 to A14. The internal complementary address signals $\overline{a9}$ to $\overline{A14}$ are also expressed in the same manner as for the above-mentioned internal complementary address signals a0. For instance, the internal complementary address signal a9 represents an internal address signal a9 which is substantially in phase with the external address signal supplied via the external terminal A9 and also represents an internal address signal $\overline{a9}$ which is substantially in opposite phase with respect thereto.

Symbol R-DCR denotes a row address decoder which receives internal complementary address signals a0 to a8 from a multiplexer MPX that will be mentioned later to form word line selection signals for selecting word lines designated by the internal complementary address signals out of a plurality of word lines formed in the memory array M-ARY. The word line selection signals are transmitted to the word lines formed in the memory array M-ARY in synchronism with word line selection timing signals $\phi x$.

Symbol C-DCR denotes a column address decoder which receives internal complementary address signals a9 to a14 to form data line selection signals that will be supplied to the memory array M-ARY. The data line selection signals are transmitted to the column switch C-SW in synchronism with data line selection timing signals $\phi y$.

Symbol PC2 denotes a precharge circuit for precharging the common complementary data lines. Though not particularly limited, the precharge circuit PC2 consists of a MOFSET which short-circuits the common complementary data lines upon receipt of a precharge signal $\phi_{pc2}$.

Symbol MA denotes a main amplifier which is constructed in the same manner as the above-mentioned sense amplifier SA. That is, the main amplifier MA consists of unit main amplifiers constituted by CMOS latch circuits, and power-switching MOSFET's provided between the side of power-source voltage $V_{DD}$ of the unit main amplifiers and the side of ground potential $V_{SS}$ (e.g. similar to the arrangement shown in schematic form for the sense amplifier SA in FIG. 4). Timing signals $\phi_{ma}$, $\overline{\phi_{ma}}$ work to turn on and off the power-switching MOSFET's substantially simultaneously.

Symbol DOB denotes a data output buffer which sends to the external terminals D0 to D7 the data corresponding to the read-out data supplied from the main amplifier MA, responsive to a read-out timing signal $\overline{\phi_{rw}}$. In the writing operation, the data output buffer DOB is rendered inoperative (i.e. it assumes high output impedance) by the timing signal $\overline{\phi_{rw}}$.

Symbol DIB denotes a data input buffer which transmits the writing data supplied from the external terminals D0 to D7 to the common complementary data lines responsive to a writing timing signal $\phi_{rw}$. In the reading operation, the data input buffer DIB is rendered inoperative by the timing signal $\phi_{rw}$.

Symbol MPX denotes a multiplexer which is served with the internal complementary address signals a0 to a8 formed by the address buffer R-ADB and with the internal complementary address signals a0 to a8 formed by an automatic refresh circuit REF that will be described later. Responsive to a switching signal produced by the automatic refresh circuit REF, the multiplexer MPX selectively transmits to the row address decoder R-DCR the internal complementary address signals a0 to a8 of either one kind between the above-mentioned two kinds of internal complementary address signals (i.e., internal complementary address signals a0 to a8 formed by the address buffer R-ADB and internal complementary address signals a0 to a8 formed by the automatic refresh circuit REF).

Symbol REF denotes an automatic refresh circuit which, though not particularly limited, contains an address counter for refreshing, a timer circuit, and the like.

The automatic refresh circuit REF forms the internal complementary address signals a0 to a8 for designating the memory cells for which the refresh operation should be effected, and forms a switching signal $\phi_{MX}$ which so switches the condition of the multiplexer MPX that the internal complementary address signals a0 to a8 are transmitted to the row address decoder R-DCR.

The automatic refresh circuit REF has two kinds of operation modes.

In the first operation mode, the automatic refresh circuit REF forms the internal complementary address signals a0 to a8 and the switching signal $\phi_{MX}$ every time a predetermined period of time has passed. In this operation mode, furthermore, the refresh signals need not be supplied from the external unit to control the refresh operation. When the refresh operation is performed in the dynamic RAM, the automatic refresh circuit REF produces a signal to the external unit to indicate that the refresh operation is being carried out.

When a refresh control signal is supplied from the external unit, the operation mode of the automatic refresh circuit REF is shifted from the first operation mode to the second operation mode in which the automatic refresh circuit REF forms the internal complementary address signals a0 to a8 and the switching signal $\phi_{MX}$ in synchronism with the refresh control signals that are supplied.

In either operation mode, the automatic refresh circuit REF forms timing signals $\phi_R$ after every formation of internal complementary address signals a0 to a8. Though not particularly limited, a timing signal generator circuit TG that will be mentioned later receives the timing signals $\phi_R$ and signals $\phi_r$ produced by the address transient detector circuit REG to form a variety of timing signals such as timing signals $\phi_{pa}$, $\overline{\phi_{pa}}$, $\phi_{pc1}$, $\phi_x$, etc. that are necessary for effecting the refresh operation, every time internal complementary address signals are formed by the automatic refresh circuit REF.

Refresh operation is effected for the memory cells that are designated by the internal complementary address signals a0 to a8.

Symbol $V_{bb}$-G denotes a substrate bias generator circuit.

The aforementioned variety of timing signals are formed by the circuit blocks described below.

Symbol REG denotes an address transient detector circuit which, though not particularly limited, receives internal address signals a0 to a8 (or $\bar{a}0$ to $\bar{a}8$) to detect the leading or trailing edge of the address signals.

Symbol CEG denotes an address transient detector circuit which, though not particularly limited, receives internal address signals a9 to a14 (or $\bar{a}9$ to $\bar{a}14$) to detect the leading or trailing edge of the address signals.

Though not particularly limited, the address transient detector circuit REG consists of exclusive OR circuits that receive internal address signals a0 to a8 as well as delay signals thereof, and OR circuits that receive signals produced by the exclusive OR circuits. The address transient detector circuit CEG is constructed in the same manner as the address transient detector circuit REG. That is, the address transient detector circuit CEG consists of exclusive OR circuits that receive internal address signals a9 to a14 as well as delay signals thereof, and OR circuits that receive signals produced by the exclusive OR circuits. Therefore, when the level of at least one signal is changed among those of the address signals a0 to a8 and a9 to a14, there are formed edge detection pulses $\phi_r$ and $\phi_c$ that are in synchronism with the timing of the change of level.

By clearly distinguishing the edge detection pulses $\phi_r$ that indicate a transient state of row address signals a0 to $\underline{a8}$ over the edge detection pulses $\phi_c$ that indicate a transient state of column address signals $\underline{a9}$ to $\underline{a14}$, it becomes possible to easily generate timing signals responsive to the transient state of row address signals and timing signals responsive to the transient state of column address signals.

Symbol TG denotes a timing signal generator circuit which forms a variety of timing signals mentioned above. The timing signal generator circuit TG forms a series of timing pulses upon receipt of edge detection pulses $\phi_r$, $\phi_c$, as well as the timing signal $\phi_R$, and a write enable signal $\overline{WE}$ and a chip select signal $\overline{CS}$ that are supplied through the external terminals.

Constitution of the memory array M-ARY will be described below in detail with reference to FIG. 4.

To simplify the drawing, FIG. 4 shows only the memory array that corresponds to the data input/output terminal D0 (FIG. 1). Memory arrays which are the same as the memory array of FIG. 4 have also been provided for the other data input/output terminals D1 to D7.

The memory array M-ARY consists of a plurality of memory rows and a plurality of word lines $W_0$ to $W_n$. The memory rows are constituted in the same manner relative to each other. In FIG. 4, only one memory row is representatively shown in detail. Each memory row consists of a pair of complementary data lines D, $\overline{D}$ arrayed in parallel with each other as shown, and memory cells which are arranged maintaining a predetermined regularity and of which the input/output nodes are coupled to one of the pair of complementary data lines D, $\overline{D}$. The individual memory cells are constructed in the same manner relative to each other. Each memory cell consists of an n-channel switching MOSFET $Q_M$ and a MOS capacitor $C_M$ coupled thereto. The gate electrode of the switching MOSFET in a memory cell serves as a select terminal of the memory cell. The select terminals of the individual memory cells are coupled to the corresponding word lines.

The precharge circuit PC1 consists of a switching MOSFET of which the source-drain path is coupled across the complementary data lines D, $\overline{D}$, as represented by an n-channel MOSFET $Q_7$.

As representatively shown in FIG. 4, each unit sense amplifier constituting the sense amplifier SA consists of a CMOS (complementary MOS) latch circuit which is made up to p-channel MOSFET's $Q_1$, $Q_3$, and n-channel MOSFET's $Q_2$, $Q_4$. A pair of input/output nodes of the CMOS latch circuit are coupled to the complementary data lines D, $\overline{D}$. Further, though not particularly limited, the latch circuit is served with the power-source voltage $V_{CC}$ via a p-channel MOSFET $Q_5$ and is served with ground voltage $V_{SS}$ of the circuit via an n-channel MOSFET $Q_6$. The power-switching MOSFET's $Q_5$, $Q_6$ have also been used in other latch circuits that are not shown but that are provided for other memory rows.

Timing signals $\phi_{pa}$, $\overline{\phi}_{pa}$ are supplied to the gates of the MOSFET's $Q_6$, $Q_5$ to activate the sense amplifier SA. The timing signals $\phi_{pa}$ and $\overline{\phi}_{pa}$ are complementarily changed relative to each other so that the power-switching MOSFET's $Q_5$ and $Q_6$ are turned on or off simultaneously. That is, the timing signal $\overline{\phi}_{pa}$ has a phase which is inverted relative to the phase of the timing signal $\phi_{pa}$.

The row address decoder R-DCR decodes the internal complementary address signals a0 to $\underline{a8}$. By the decoding, a word line designated by the internal complementary address signals is selected out of a plurality of word lines $W_0$ to $W_n$. The selected word line assumes a potential of select level (high level) in synchronism with a select timing signal $\phi_x$.

The column address detector C-DCR decodes the internal complementary address signals $\underline{a9}$ to $\underline{a14}$. A select signal formed by the decoding is supplied to the column switch C-SW in synchronism with a select timing signal $\phi_y$. Therefore, a memory row designated by the internal complementary address signals $\underline{a9}$ to $\underline{a14}$ is selected out of a plurality of memory rows, and the pair of complementary data lines D, $\overline{D}$ constituting the memory row are coupled to the common data lines CD, $\overline{CD}$.

The column switch C-SW consists of MOSFET's that are provided between the complementary data lines D, $\overline{D}$ and between the common complementary data lines CD, $\overline{CD}$, as represented by MOSFET's $Q_9$, $Q_8$ in FIG. 4.

The gates of the MOSFET's $Q_9$, $Q_8$ are served with a select signal supplied from the column address decoder C-DCR.

A precharge MOSFET $Q_{10}$ which constitutes the precharge circuit PC2 is provided between the common complementary data lines CD and $\overline{CD}$.

A pair of input/output nodes of the main amplifier constructed in the same manner as the sense amplifier SA are coupled to the common complementary data lines CD, $\overline{CD}$.

Further, complementary output nodes of the data input buffer DIB are coupled to the common data lines CD, $\overline{CD}$.

Operation of the dynamic RAM will be described below in conjunction with FIGS. 1 and 4.

If the internal address signal an changes, the address transient detector circuit REG (CEG) produces an edge detection pulse $\phi_r$ ($\phi_c$).

Responsive to the edge detection pulse $\phi_r$ ($\phi_c$), the timing signal generator circuit TG resets the timing signals $\phi_x$, $\phi_y$, $\phi_{pa}$, $\overline{\phi}_{pa}$, $\phi_{ma}$ and $\overline{\phi}_{ma}$ (so that they assume reset levels). For example, timing signals $\phi_x$, $\phi_y$, $\phi_{pa}$ and $\phi_{ma}$ assume the low level, and the timing signals $\overline{\phi}_{pa}$ and $\overline{\phi}_{ma}$ assume the high level. Therefore, the sense amplifier SA and the main amplifier MA are rendered inoperative, and the complementary data lines D, $\overline{D}$ and the common complementary data lines CD, $\overline{CD}$ are floated.

Parasitic capacities which are not shown are coupled to the complementary data lines D, $\overline{D}$ and to the common complementary data lines CD, $\overline{CD}$. In the parasitic capacities are accumulated electric charges corresponding to potentials of data lines D, $\overline{D}$ of the previous operation cycle. For instance, if the potential of the complementary data line D was the high level ($V_{CC}$) and the potential of the complementary data line $\overline{D}$ was the low level (0 V) in the previous operation cycle, the electric charge corresponding to the high level ($V_{CC}$) is stored in the parasitic capacity of the complementary data line D, and an electric charge corresponding to the low level (0 V) is stored in the parasitic capacity of the complementary data line $\overline{D}$. Similarly, electric charges corresponding to the high level or low level have been stored in the parasitic capacities of common data lines CD, $\overline{CD}$. As described above, if the complementary data lines D, $\overline{D}$ and the common data lines CD, $\overline{CD}$ are placed under the floating condition, the complementary data line D maintains a potential of the high level ($V_{CC}$) and the complementary data line $\overline{D}$ maintains a potential of the low level. This also holds true for the common data lines CD, $\overline{CD}$.

Next, the timing signal generator circuit TG generates timing signals $\phi_{pc1}$ and $\phi_{pc2}$. The precharge MOSFET's $Q_7$, $Q_{10}$ are turned on by the precharge pulses $\phi_{pc1}$, $\phi_{pc2}$ and, hence, the complementary data lines D, $\overline{D}$ and the common complementary data lines CD, $\overline{CD}$ are short-circuited, respectively. Therefore, the electric charges are shared by the complementary data lines D, $\overline{D}$ and by the common complementary data lines CD, $\overline{CD}$. Accordingly, the complementary data lines D, $\overline{D}$ and the common complementary data lines CD, $\overline{CD}$ are precharged to an intermediate level of about $V_{CC}/2$.

After the complementary data lines D, $\overline{D}$ have been precharged, the word line select timing signal $\phi_x$ rises to the high level. The row address decoder R-DCR then sends a signal of the high level to a word line that is designated by the internal complementary address signals a0 to a8. That is, the selected word line assumes the high level. Due to the potential of the high level of this selected word line, the switching MOSFET constituting a memory cell is turned on.

The electric charge is shared by the parasitic capacity of one data line, e.g., the data line $\overline{D}$ to which the selected memory cell is coupled and by the memory capacitor of the memory cell. The level of data line $\overline{D}$ is changed to a potential corresponding to the electric charge stored in the memory capacitor of the memory cell or, in other words, corresponding to the data stored in the memory cell. In this case, the memory cell coupled to the other data line D is not selected. Therefore, the data lines D maintains the precharge level $V_{CC}/2$. Accordingly, there develops a small potential difference between the data line D and the data line $\overline{D}$, the small potential difference being corresponded to the data stored in the selected memory cell. The small potential difference between the data lines D and $\overline{D}$ is described below concretely. That is, when an electric charge corresponding to $V_{CC}$ is stored in the memory capacitor of the memory cell coupled to the data line $\overline{D}$, the potential of the data line $\overline{D}$ becomes greater than the potential ($V_{CC}/2$) of the data line D. On the other hand, when an electric charge corresponding to 0 V is stored in the memory capacitor of the memory cell or, in other words, when no electric charge is stored in the memory capacitor, the potential of the data line $\overline{D}$ becomes smaller than the potential ($V_{CC}/2$) of the data line D. The small voltage difference between the data lines $\overline{D}$ and D is amplified by the sense amplifier SA when it is activated. That is, when the timing signal $\phi_{pa}$ assumes the high level (timing signal $\overline{\phi}_{pa}$ assumes the low level) in the next time, the sense amplifier SA is activated to amplify the potential difference between the complementary data lines D and $\overline{D}$.

Next, the select timing signal $\phi_Y$ assumes the high level, and the precharge signal $\phi_{pc2}$ assumes the low level.

As the precharge signal $\phi_{pc2}$ assumes the low level, the MOSFET $Q_{10}$ is turned off, and the precharge for the common complementary data lines CD, $\overline{CD}$ is finished.

Further, as the select timing signal $\phi_Y$ assumes the high level, a column select signal is supplied from the column decoder C-DCR to the column switch CSW to connect the pair of complementary data lines D, $\overline{D}$ determined by the address signals a9 to a14 to the common data lines CD, $\overline{CD}$. Therefore, the pair of complementary data lines D, $\overline{D}$ selected by the column select signal are connected to the common complementary data lines DC, $\overline{CD}$ via the column switch CSW.

The common complementary data lines CD, $\overline{CD}$ have also been precharged to $V_{CC}/2$ by the electric charge which has been precharged by the precharge MOSFET $Q_{10}$ as described earlier. Accordingly, the potential of the common data line $\overline{CD}$ is determined by the electric charge (corresponding to $V_{CC}/2$) stored in the parasitic capacity of the common data line $\overline{CD}$ and the electric charge stored in the parasitic capacity of the data line $\overline{D}$ which is selected and coupled to the common data line $\overline{CD}$. Similarly, the potential of the common data line CD is determined by the electric charge (corresponding to $V_{CC}/2$) stored in the parasitic capacity of the common data line CD and the electric charge stored in the parasitic capacity of the data line D which is selected and coupled to the common data line CD.

That is, as the complementary data lines D, $\overline{D}$ are coupled to the common complementary data lines CD, $\overline{CD}$, the potential of the common data line CD determined by the electric charge in the parasitic capacity of data line D and electric charge stored in the parasitic capacity of common data line CD, becomes higher (lower) than the potential of the common data line $\overline{CD}$ determined by the electric charge stored in the parasitic capacity of data line $\overline{D}$ and the electric charge stored in the parasitic capacity of common data line $\overline{CD}$.

The potential difference between the common data lines CD and $\overline{CD}$ is amplified by the main amplifier MA. That is, as the timing signal $\phi_{ma}$ assumes the high level and the timing signal $\overline{\phi}_{ma}$ assumes the low level in the next time, the main amppliifier MA operates responsive thereto to amplify the potential difference between the common data lines CD and $\overline{CD}$.

In the reading operation, the potential difference amplified by the main amplifier MA is supplied to the data output buffer DOB which sends an output signal corresponding to the input signal to the input/output terminal DO.

In the writing operation, write data is transmitted to the common data lines CD, $\overline{CD}$ via the data input buffer DIB. The potential levels of the data lines, D, $\overline{D}$ are determined depending upon the write data supplied to the common data lines CD, $\overline{CD}$. Accordingly, the write data is transmitted to a memory cell which is selected.

In the reading operation, the potentials of the selected complementary data lines D, $\overline{D}$ are amplified by the sense amplifier SA to the high level ($V_{CC}$) and the low level (0 V), and the potentials of the common complementary data lines CD, $\overline{CD}$ are also amplified by the main amplifier MA to the high level ($V_{CC}$) and the low level (0 V). The potentials of the complementary data lines D, $\overline{D}$ which have not been selected are also amplified by the sense amplifier SA of that row to the high level ($V_{CC}$) and the low level (0 V).

The potentials of data lines amplified to the high level or the low level by the sense amplifier SA are transmitted and written in the MOS capacity of the selected memory cells. Namely, the refresh operation is substantially effected for the memory cells.

In the writing operation, potentials of the common data lines CD, $\overline{CD}$ and of the selected data lines D, $\overline{D}$ are amplified to the high level ($V_{CC}$) or the low level (0 V) by the data input buffer DIB and the sense amplifier SA depending upon the write data. For instance, depending upon the write data, the potentials of the common data line CD and of the selected data line D are amplified to the high level ($V_{CC}$) and the potentials of the common data line $\overline{CD}$ and of the selected data line $\overline{D}$ are decreased to the low level (0 V). Further, the potentials of the complementary data lines D, $\overline{D}$ which have not been selected are amplified to the high level ($V_{CC}$) and the low level (0 V) by the sense amplifier SA of that row. The potentials of data lines D, $\overline{D}$ amplified to the high level or the low level are written again onto the selected memory cells of that row. That is, the refresh operation is substantially effected for the memory cells in the same manner as that of the aforementioned reading operation.

In either operation as described above, potentials of the data lines D, $\overline{D}$ are amplified to the high level ($V_{CC}$) or the low level (0 V), and potentials of the common data lines CD, $\overline{CD}$ are also amplified to the high level ($V_{CC}$) or the low level (0 V). Therefore, the capacitors of data lines D, $\overline{D}$ store an electric charge corresponding to the high level and an electric charge corresponding to the low level, respectively. Similarly, the capacitors of common data lines CD, $\overline{CD}$ also store an electric charge corresponding to the high level and an electric charge corresponding to the low level. Namely, as the electric charge corresponding to the high level ($V_{CC}$) is stored in the capacitor of one data line D or $\overline{D}$ (common data line CD or $\overline{CD}$), the electric charge corresponding to the low level (0 V) is stored in the capacitor of the other data line D or $\overline{D}$ (common data line CD or $\overline{CD}$).

The electric charges stored in the capacitors of data lines D, $\overline{D}$ and of common data lines CD, $\overline{CD}$ are used for precharging the data lines D, $\overline{D}$ and for precharging the common data lines CD, $\overline{CD}$ as mentioned earlier. That is, the electric charges are used for precharging the data lines D, $\overline{D}$ and the common data lines CD, $\overline{CD}$ in the next operation.

In the dynamic RAM of this embodiment, the refresh operation can also be performed by the automatic refresh circuit REF in addition to the refresh operation which is substantially carried out in the reading operation or in the writing operation.

That is, the internal complementary address signals a0 to a8 to be supplied to the row address decoder R-DCR are formed by the automatic refresh circuit REF. A word line designated by the internal complementary address signals a0 to a8 is selected out of a plurality of word lines $W_0$ to $W_n$, and the potential of the selected word line is raised to the high level. Therefore, a plurality of memory cells of which the select terminals are coupled to the selected word line, are selected. The potential of one complementary data line D, $\overline{D}$ coupled to input/output terminals of the selected memory cells is determined depending upon the data of the memory cells like in the above-mentioned reading operation. A potential difference between this complementary data line D, $\overline{D}$ and the other complementary data line D or $\overline{D}$ is amplified by the sense amplifier SA which is provided for the memory row that include these memory cells. Owing to the amplification operation, the potential of one data line (D or $\overline{D}$) amplified to the high level or the low level is applied to the memory capacitors of the selected memory cells. Therefore, the memory capacitors of the selected memory cells store the electric charge which corresponds to the potential of one data line D or $\overline{D}$. In other words, the data in the selected memory cells are read onto the data line D or $\overline{D}$ of a memory row of these memory cells, and the data read out are amplified by the sense amplifier SA provided for this memory row. The amplified data are then written again onto the same selected memory cells.

Here, although not specifically limited, the word line select timing signal $\phi_X$ at the time of writing the data onto the memory cells is raised to a level higher than the power-source voltage $V_{CC}+V_{th}$ ($V_{th}$ denotes a threshold voltage of the switching MOSFET) by a bootstrap circuit that is not shown, such that a voltage higher than the power-source voltage $V_{CC}+V_{th}$ is applied to the gates of switching MOSFET's of the memory cells. This makes it possible to transmit the potential of high level ($V_{CC}$) of the data line D or $\overline{D}$ to the MOS capacitors of the memory cells without any loss of potential level; i.e., an increased amount of electric charge can be stored in the MOS capacitors.

In rewriting (refreshing) the data onto the memory cells, furthermore, the word line select timing signal $\phi_X$ is raised by a bootstrap circuit that is not shown to a level higher than the power-source voltage $V_{CC}+V_{th}$. This enables the potential of the high level ($V_{CC}$) of the data line D or $\overline{D}$ to be rewritten without loss onto the MOS capacitors of memory cells which have maintained the high level.

Figure 2:
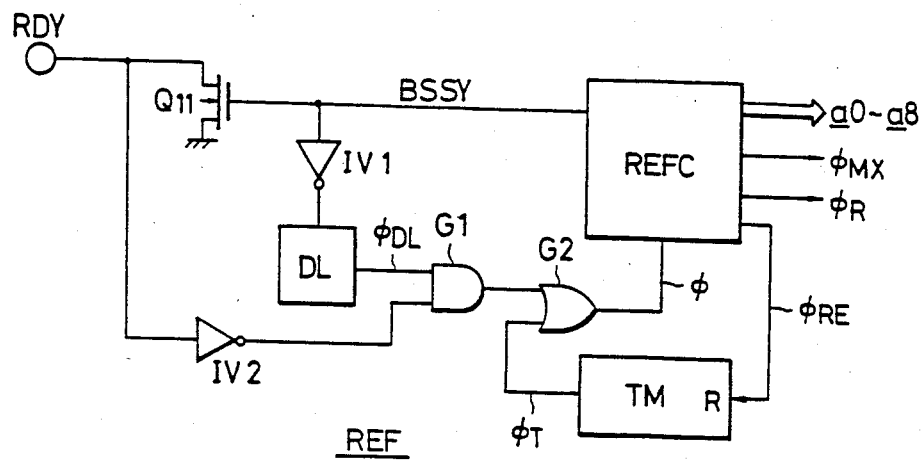
FIG. 2 is a diagram showing an automatic refresh circuit according to the embodiment of the present invention.

FIG. 2 is a diagram of the automatic refresh circuit REF according to a preferred embodiment of the present invention.

In FIG. 2, symbol TM denotes a timer circuit which form a timing pulse $\phi_T$ every time a predetermined period of time has passed. As will be mentioned later in detail, the timing pulse $\phi_T$ serves as a starting signal for starting the refresh control circuit REFC.

Although not specifically limited, the timer circuit TM receives through the reset terminal R thereof a reset signal $\phi_{RE}$ formed by the refresh control circuit REFC that will be described later. The timer circuit TM is reset by the reset signal $\phi_{RE}$. Under the reset condition, the timer circuit TM is inhibited from measuring the time. As the timer circuit TM is liberated from the reset condition, the timer circuit forms a timing pulse $\phi_T$ after a predetermined period of time has passed from the moment of liberation. Such a timer circuit TM can be constructed in a variety of forms. For instance, the timer circuit TM can be made up of a capacitor of which one electrode is coupled to a point of ground potential of the circuit, a resistor element coupled between the other electrode of the capacitor and a power-source voltage terminal, and a switching MOSFET of which the drain-source path is coupled between the other electrode of said capacitor and the point of ground potential of the circuit and which receives the reset signal $\phi_{RE}$ through the gate thereof. In this case, the timing pulse $\phi_T$ is taken out from the other electrode of the capacitor. The reset operation is effected when the switching MOSFET is turned on by the reset signal $\phi_{RE}$. Further, the time from the moment the timer circuit is liberated from the reset condition to the moment at which the timer circuit forms the timing pulse $\phi_T$ is determined by a time constant determined by the capacitor and the resistor element, and by a threshold voltage of a gate circuit G2.

Although not specifically limited, the timing pulse $\phi_T$ formed by the timer circuit TM is input to one input terminal of an OR gate circuit G2. The OR gate circuit G2 further receives through its other input terminal a starting signal supplied from an external unit via an external terminal RDY. Though not specifically limited, in this embodiment the starting signal supplied through the external terminal RDY is inverted for its phase by an inverter circuit IV2 and is supplied to one input terminal of an AND gate circuit G1. The AND gate circuit G1 further receives through its other input terminal a busy signal BSSY that is sent from the refresh control circuit REFC mentioned later, that is inverted for its phase by an inverter circuit IV1, and that is delayed by a delay circuit DL. The busy signal BSSY is also supplied to the gate of an open-drain output MOSFET $Q_{11}$. The drain of the output MOSFET $Q_{11}$ is connected to the external terminal RDY.

Upon receipt of a signal from the OR gate circuit G2, the refresh control circuit REFC forms refresh address signals a0 to a8, switching signal $\phi_{MX}$, reset signal $\phi_{RE}$, timing signal $\phi_R$ and busy signal BSSY. The refresh control circuit REFC includes a counter which forms refresh address signals, i.e., which forms address signals for designating memory cells for which the refresh operation is to be effected, and includes a refresh signal generator circuit which forms the above-mentioned switching signal $\phi_{MX}$, reset signal $\phi_{RE}$, timing signal $\phi_R$, and busy signal BSSY.

Upon receipt of the starting signal from the gate circuit G2, the refresh address counter counts up (or counts down). Although there is no particular limitation, when the starting signal is supplied from the gate circuit G2 after the counted value has reached a final value, the value returns to the initial value, and the counter again repeats the count-up operation. Therefore, the automatic refresh circuit REF forms the internal complementary address signals a0 to a8 that select the word lines successively in the order of, for example, from $W_0$ to $W_n$. After having formed the internal complementary address signals that select the word line $W_n$, the automatic refresh circuit REF forms again the internal complementary address signals that select the word lines in the order of from $W_0$ to $W_n$.

Though not specifically limited, the refresh signal generator circuit in the refresh control circuit REFC is served with the starting signal from the gate circuit G2. Responsive to the starting signal, the refresh signal generator circuit forms a variety of signals that were mentioned earlier. That is, during the refresh operation, the refresh signal generator circuit produces a switching signal $\phi_{MX}$ which switches the multiplexer MPX such that the internal complementary address signals a0 to a8 formed by the automatic refresh circuit REF are supplied to the row address decoder R-DCR, and further raises the potential of the busy signal BSSY to the high level. During the refresh operation, furthermore, the refresh signal generator circuit produces the timing signal $\phi_R$ and the reset signal $\phi_{RE}$.

Though not specifically limited, the timer circuit TM forms the starting signal maintaining such a time interval that one turn of the refresh address counter is brought into agreement with the refresh period of the memory cells.

Figure 5:
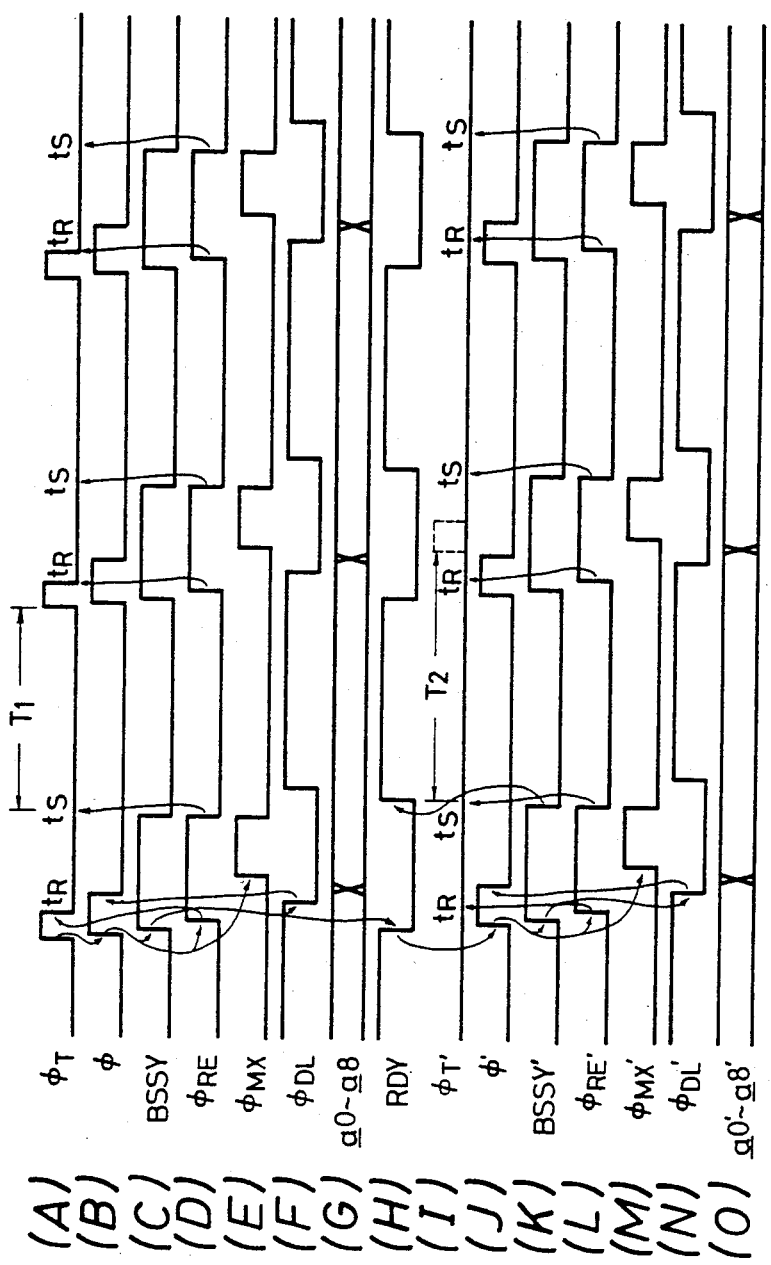
FIG. 5 is a diagram of waveforms for explaining the operation of the automatic refresh circuit of FIG. 2.

FIG. 5 is a diagram of operation waveforms of the automatic refresh circuit of FIG. 2.

Operation of the circuit of the embodiment will be described below in conjunction with the waveforms of FIG. 5.

As the timing pulse $\phi_T$ produced by the timer circuit TM assumes the high level (logic "1") as shown in FIG. 5(A), the gate circuit G2 produces the starting signal $\phi$ of the high level. The refresh control circuit REFC starts to operate responsive to the starting signal $\phi$ of the high level. That is, as the starting signal $\phi$ assumes the high level, the refresh address counter performs the count-up operation responsive thereto. Responsive to the starting signal $\phi$, furthermore, the refresh signal generator circuit produces the busy signal BSSY, reset signal $\phi_{RE}$, and switching signal $\phi_{MX}$ as shown in FIGS. 5(C), 5(D) and 5(E). The timing signal $\phi_R$ is also formed responsive to the starting signal $\phi$. To simplify the drawing, FIG. 5 does not illustrate the waveform of the timing signal $\phi_R$.

As the switching signal $\phi_{MX}$ assumes the high level, the multiplexer MPX transmits the internal complementary address signals formed by the automatic refresh circuit REF to the row address decoder R-DCR instead of transmitting the internal complementary address signals a0 to a8 that are formed by the row address buffer R-ADB. That is, the internal complementary address signals a0 to a8 for refresh operation formed by the refresh address counter that is counted up by the count-up operation, are transmitted to the row address decoder R-DCR. Consequently, the refresh operation is performed for a memory column (a memory column consists of a word line and a plurality of memory cells of which the select terminals are coupled to the word line) according to address signals a0 to a8 formed by the counter, among a plurality of memory columns constituting the memory array M-ARY.

The busy signal BSSY is maintained at the high level as long as the refresh operation is being carried out. During this moment, therefore, the output MOSFET $Q_{11}$ is maintained conductive and the potential at the external terminal RDY is maintained at the low level. In other words, the self refresh operation is carried out, and a signal representing the busy condition is produced by the dynamic RAM via the external terminal.

For instance, the external terminal RDY is coupled to the power-source voltage terminal via a resistor element. When the refresh operation is not being carried out, the busy signal BSSY assumes the low level and the MOSFET $Q_{11}$ is turned off. In this case, therefore, the potential of the external terminal RDY is maintained at the high level. In other words, when the dynamic RAM is under the condition (ready condition) of being capable of effecting the writing operation or the reading operation, a signal indicating this condition is produced from the external terminal RDY.

Namely, depending upon the potential of the signal produced from the external terminal RDY, it is possible to know whether the dynamic RAM is under the ready condition (of being capable of effecting the writing or reading operation) or under the busy condition (in which the refresh operation is carried out). Hereinbelow, production of a signal of the low level from the external terminal RDY is often referred to as the production (formation) of busy signal $\overline{\text{RDY}}$ and production of a signal of the high level from the external terminal RDY is often referred to as the production (formation) of ready signal RDY. As will be mentioned later in detail, the external terminal RDY also receives the starting signal for starting the refresh control circuit REFC.

The dynamic RAM can be easily handled since it forms the ready signal RDY and the busy signal $\overline{\text{RDY}}$.

That is, while the ready signal RDY is being produced, the writing operation or the reading operation is performed for the dynamic RAM and while the busy signal $\overline{\text{RDY}}$ is being produced, the writing operation or the reading operation is not performed for the dynamic RAM. This makes it possible to perform the necessary refresh operation; i.e., to perform a correct writing operation or reading operation. The dynamic RAM does not require any particular refresh signal that was needed in the conventional dynamic RAM. Therefore, the dynamic RAM can be treated easily.

If the writing operation or the reading operation is performed for the dynamic RAM while the refresh operation is being effected, it is not possible to write the data onto desired memory cells or to read the data therefrom. Namely, there develops an erroneous operation.

Further operation of the embodiment of the invention will now be described.

As the reset signal $\phi_{RE}$ assumes the high level, the timer circuit TM is reset ($t_R$) responsive thereto. The timer circuit TM is liberated from the reset condition when the reset signal $\phi_{RE}$ assumes again the low level. The timer circuit TM produces a signal $\phi_T$ of the high level after a predetermined period of time $T_1$ has passed from a moment ($t_S$) at which it was liberated from the reset condition. The above-mentioned operation is repeated every after the signal $\phi_T$ of the high level is produced from the timer circuit TM. Therefore, the self refresh operation is performed every after a predetermined period of time.

As will be mentioned later in detail, a delay signal $\phi_{DL}$ which is delayed behind the busy signal BSSY is used for reliably starting the refresh control circuit REFC.

The foregoing description has dealt with the case in which the automatic refresh circuit REF was operated in the first operation mode. Described below is the case when the automatic refresh circuit REF is operated in the second operation mode.

When the potential of the external terminal RDY assumes the low level while the signal $\phi_T'$ produced by the timer circuit TM is assuming the low level as shown in FIGS. 5(I) and 5(H) or, in other words, while the refresh operation is not being effected, the signal produced by the inverter circuit IV2 assumes the high level (logic "1"). At this moment, furthermore, the busy signal BSSY' is assuming the low level (logic "0") as shown in FIG. 5(K). Therefore, the signal $\phi_{DL}'$ which has passed through the inverter circuit IV1 and the delay circuit DL assumes the high level. Accordingly, since the AND gate circuit G1 remains open, the signal of the high level produced by the inverter circuit IV2 is supplied as a starting signal $\phi'$ to the refresh control circuit REFC. The refresh control circuit REFC therefore is started. Like the case of the above-mentioned first operation mode, the refresh control circuit REFC which is started produces internal complementary address signals a0' to a8' that are stepped, switching signal $\phi_{MX'}$, reset signal $\phi_{RE'}$, busy signal BSSY, and timing signal $\phi_R'$. Therefore, the refresh operation is effected for a memory column that is designated by the internal complementary address signals a0' to a8'. The potential at the external terminal RDY is maintained at the low level as long as the refresh operation is being carried out. In other words, even in the second operation mode, the busy signal $\overline{\text{RDY}}$ is produced as long as the refresh operation is being carried out.

In this embodiment, provision is made of a delay circuit DL to reliably start the refresh control circuit REFC. Without the delay circuit DL, the AND gate circuit G1 closes if a busy signal BSSY of the high level is produced by the refresh control circuit REFC. This causes the starting signal $\phi$ to have a reduced width, and prevents the refresh address counter from performing the stepping operation. On the other hand, with the delay circuit DL being provided as in the embodiment of the present invention, the gate circuit G1 can be maintained open for a predetermined period of time which is necessary for starting the refresh control circuit REFC. This enables the starting signal $\phi$ to have a width which is so broadened as to assure a time necessary for the refresh address counter to perform the stepping operation.

Figure 3:
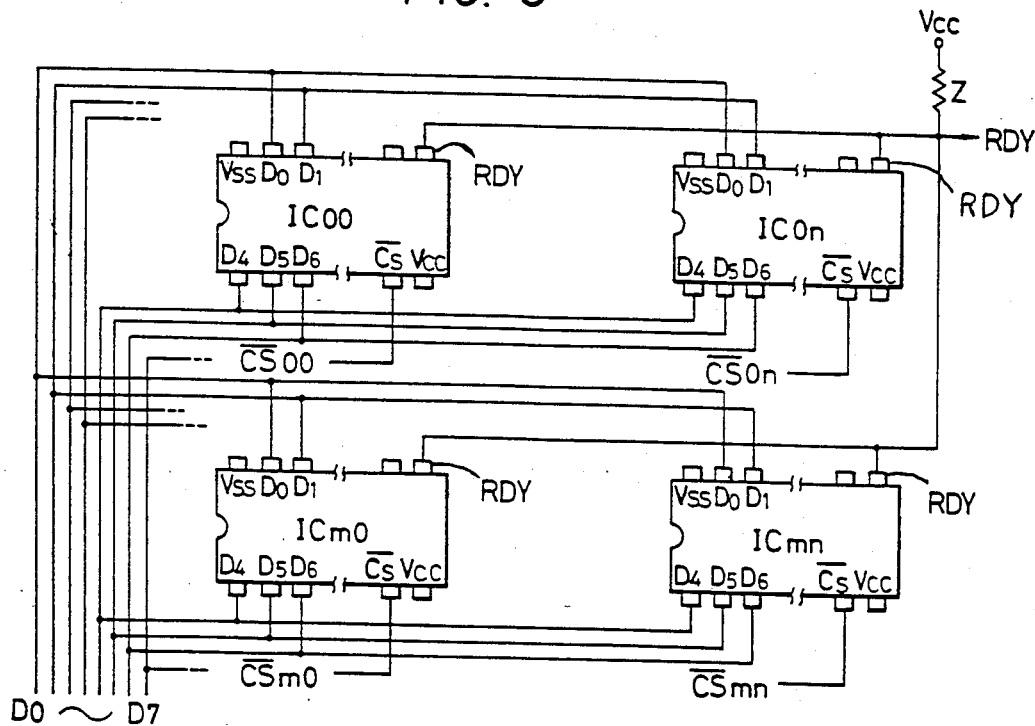
FIG. 3 is a block diagram of a memory system according to the embodiment of the present invention.

FIG. 3 is a block diagram of a memory system constituted by a plurality of dynamic RAM's $IC_{00}$ to $IC_{mn}$. Each of the dynamic RAM's has the circuit setup as shown in FIG. 1. Further, the external terminals RDY of the dynamic RAM's are commonly connected together and are coupled to the power-source voltage $V_{CC}$ via resistance means Z. That is, the logic of wired OR is established among the external terminals RDY. Though not specifically limited, the data input/output terminals D0 to D7 of the dynamic RAM's are coupled to the corresponding data input/output terminals of the microprocessor (not shown), and the address input terminals A0 to A14 (not shown) thereof are coupled to the corresponding address output terminals of the microprocessor. The commonly connected external terminals RDY are coupled to a bus request terminal $\overline{\text{BREQ}}$ of the microprocessor. The microprocessor executes the instruction when the potential of the bus request terminal $\overline{\text{BREQ}}$ has the high level, and discontinues the execution of instruction when the potential has the low level. Microprocessors having such a function have been widely known, and details are not described here.

With the memory system being constructed as mentioned above, the refresh operation for the dynamic RAM's $IC_{00}$ to $IC_{mn}$ is performed in synchronism with the refresh operation of the dynamic RAM having a timer circuit TM which forms a timing signal $\phi_T$ at the earliest timing among these dynamic RAM's. For instance, it is assumed that the dynamic RAM $IC_{00}$ has the timer circuit TM that forms a timing signal $\phi_T$ at the earliest timing. In this case, the dynamic RAM $IC_{00}$ initiates the refresh operation responsive to the signal formed by the timer circuit TM contained therein, and sends a busy signal $\overline{RDY}$ to the external terminals RDY of the remaining dynamic RAM's. For the remaining dynamic RAM's, the busy signal $\overline{RDY}$ serves as a starting signal for starting the refresh control circuit REFC. Therefore, as the dynamic RAM IC$_{00}$ performs the refresh operation, the remaining dynamic RAM's also perform the refresh operation in synchronism therewith nearly simultaneously.

The above-mentioned operation is described below in detail with reference to dynamic RAM's IC$_{00}$ in conjunction with the waveform diagram of FIG. 5. Here, it is assumed that the dynamic RAM IC$_{0n}$ contains the timer circuit TM that forms a timing pulse $\phi_T$ at a timing lagged behind that of the timer circuit TM contained in the dynamic RAM IC$_{00}$. In other words, described below is the case where the period of timing pulse $\phi_T$ formed by the timer circuit TM in the dynamic RAM IC$_{00}$ is not in agreement with the period of timing pulse $\phi_T'$ formed by the timer circuit TM in the dynamic RAM IC$_{0n}$, i.e., the timing pulse $\phi_T$ has a period which is longer than a period of the timing pulse $\phi_T'$.

Thus, the dynamic RAM's have timer circuits TM that form timing pulses $\phi_T$ with different periods, because of the reasons described below.

That is, the conditions for manufacturing the dynamic RAM IC$_{00}$ may often differ from the conditions for manufacturing the dynamic RAM IC$_{0n}$. Due to the difference in the manufacturing conditions, elements constituting the timer circuit TM in the dynamic RAM IC$_{00}$ may have characteristics that are different from the characteristics of elements constituting the timer circuit TM in the dynamic RAM IC$_{0n}$. Consequently, the time (period) T$_1$ for forming the timing pulse $\phi_T$ of the timer circuit TM in the dynamic RAM IC$_{00}$ becomes different from the time (period) T$_2$ for forming the timing pulse $\phi_T$ of the timer circuit TM in the dynamic RAM IC$_{0n}$.

Due to the difference in the manufacturing conditions, furthermore, elements constituting the refresh control circuit REFC in the dynamic RAM IC$_{00}$ possess characteristics that are different from the characteristics of elements constituting the refresh control circuit REFC in the dynamic RAM IC$_{0n}$. Consequently, the time required, for example, for the refresh control circuit REFC in the dynamic RAM IC$_{0n}$ to produce the busy signal BSSY after having received the starting signal $\phi$, becomes longer than that of the dynamic RAM IC$_{00}$. However, the difference in delay time that stems from the difference in manufacturing conditions is relatively small owing to the fact that the delay time from the moment at which the starting signal $\phi$ is received to the moment at which the busy signal BSSY is formed has been set to be smaller than the periods of the timer circuits TM and owing to the known features of the semiconductor integrated circuit devices (i.e., among a plurality of elements formed on the same semiconductor substrate, ratios of characteristics such as resistances become nearly constant for the variance in the manufacturing conditions). That is, the difference is relatively small between the delay time from the moment the starting signal $\phi$ is received to the moment the busy signal BSSY is formed by the refresh control circuit REFC in the dynamic RAM IC$_{00}$ and the delay time from the moment the starting signal $\phi$ is received to the moment the busy signal BSSY is formed by the refresh control circuit REFC in the dynamic RAM IC$_{0n}$.

When the timer circuit TM substantially consists of a ring oscillator constituted, for example, by inverters (logic circuits) and when the delay time which is required for (or is inevitably formed in) the refresh control circuit REFC to form various signals responsive to the starting signal $\phi$, is formed by a delay circuit that is constituted by cascade-connected inverters (logic circuits), the delay time of each of the inverters (ligic circuits) will change depending upon variance in the manufacturing conditions. The timer circuit TM is made up of a relatively large number of inverters since it must form a timing pulse $\phi_T$ of a relatively long period. The refresh control circuit REFC, on the other hand, forms various signals within relatively short periods of time after the starting signal $\phi$ has been supplied. Therefore, the delay circuit can be constituted by a relatively small number of inverters. Accordingly, the change in delay time which stems from variance in the manufacturing conditions, for example, the change in time from the moment the starting signal $\phi$ is formed to the moment the busy signal BSSY is formed, is smaller than the change of period of timer circuits TM that stems from variance in the manufacturing conditions.

In FIG. 5, therefore, only the period of timing pulse $\phi_T'$ produced by the timer circuit TM in the dynamic RAM IC$_{0n}$ is regarded to be changed by variance in the manufacturing conditions.

FIGS. 5(A), 5(B), 5(C), 5(D), 5(E) and 5(F) show timing pulse $\phi_T$, starting signal $\phi$, reset signal $\phi_{RE}$, switching signal $\phi_{MX}$ and delay signal $\phi_{DL}$ of the dynamic RAM IC$_{00}$, and FIG. 5(G) shows internal complementary address signals a0 to a8 produced by the refresh control circuit REFC contained in the dynamic RAM IC$_{00}$.

FIG. 5(H) shows the change in potential of the wiring RDY to which are connected external terminals RDY of the dynamic RAM's.

As a timing pulse $\phi_T$ of the high level is produced by the timer circuit TM in the dynamic RAM IC$_{00}$, the gate circuit G2 in the dynamic RAM produces a starting signal $\phi$ of the high level. Accordingly, busy signal BSSY, reset signal $\phi_{RE}$, switching signal $\phi_{MX}$ and delay signal $\phi_{DL}$ are produced as mentioned earlier. The count-up operation is effected for the address counter in the dynamic RAM, and the automatic refresh circuit REFC produces internal complmentary address signals a0 to a8 that are stepped. In the dynamic RAM IC$_{00}$, therefore, the refresh operation is effected for the memory cells designated by the internal complementary address signals a0 to a8 that are stepped. When the refresh operation is effected, the busy signal BSSY assumes the high level, and the potential at the external terminal RDY of the dynamic RAM IC$_{00}$ assumes the low level. Therefore, the potential of the wiring RDY assumes the low level.

As the potential of the wiring RDY assumes the low level, the inverter IV2 in the dynamic RAM IC$_{0n}$ forms an output signal of the high level responsive thereto. Therefore, the gate circuit G2 in the dynamic RAM IC$_{0n}$ produces a starting signal $\phi'$ of the high level as shown in FIG. 5(J). Consequently, the refresh control circuit REFC in the dynamic RAM IC$_{0n}$ produces busy signal BSSY', reset signal $\phi_{RE}'$ and switching signal $\phi_{MX}'$ as shown in FIGS. 5(K), 5(L) and 5(M), as well as internal complementary address signals a0' to a8' that are stepped. In the dynamic RAM IC$_{0n}$, therefore, the refresh operation is effected for the memory cells (memory column) designated by the internal complementary address signals a0' to a8' that are stepped.

As the potential of the busy signal BSSY' assumes the low level, the output MOSFET $Q_{11}$ in the dynamic RAM $IC_{0n}$ is rendered nonconductive. This causes the potential of the wiring RDY to assume the high level through pull-up resistance means Z.

After a predetermined period of time $T_1$ has passed from the moment $t_S$ the timer circuit TM is liberated from the reset condition, the timer circuit TM in the dynamic RAM $IC_{00}$ produces again a timing pulse $\phi_T$ of the high level. Therefore, the refresh operation is effected for other memory cells designated by address signals a0 to a8 that are stepped.

On the other hand, after a time $T_2$ has passed from the moment $t_S$ at which the timer TM in the dynamic RAM $IC_{0n}$ is liberated from the reset condition, the timer circuit TM works to form a timing pulse $\phi_{T'}$ of the high level as indicated by a broken line in FIG. 5(I). However, the timer circuit TM is reset at a preceding moment $t_R$ and is not allowed to form the timing pulse $\phi_{T'}$ of the high level. Every time the potential of the wiring RDY assumes the low level, therefore, the refresh operation is effected for other memory cells designated by the address signals a0' to a8' that are stepped.

The above description has dealt with the case in which the timing pulse $\phi_{T'}$ assumes the high level later than the moment $t_R$. However, operations in the dynamic RAM's $IC_{00}$ and $IC_{0n}$ are carried out nearly in the same manner as described above even when the timing pulse $\phi_{T'}$ assumes the high level between a moment at which the potential of the wiring RDY breaks and the moment $t_R$.

The potential of the wiring RDY is maintained at the low level as far as the refresh operation is effected for the dynamic RAM's $IC_{00}$ to $IC_{mn}$. Therefore, as far as the refresh operation is effected for the dynamic RAM's, the microprocessor does not execute the instruction, and data are not written onto, or are not read out from, the dynamic RAM's. In other words, the output signal of the wired OR established among the external terminals RDY serves as a busy signal or a ready signal for the memory system.

As described above, refresh operations for the individual dynamic RAM's are performed in synchronism with each other, and the period in which the potential of the wiring RDY assumes the low level (period in which the busy signal is produced) is shortened. In other words, it is possible to enhance the through-put of the system to shorten the period in which it is not allowed to write the data onto, or to read out the data from, the memory system.

In the memory system shown in FIG. 3, furthermore, it is allowed to reduce the consumption of electric power without greatly decreasing the through-put.

Namely, some dynamic RAM's among the dynamic RAM's of FIG. 3 are not usually served with the power-source voltage $V_{CC}$ but are served with the power-source voltage $V_{CC}$ only at the required moments. This enables the memory system to consume a reduced amount of electric power. In this case, the timing at which the timing pulses $\phi_T$ are produced by the timer circuits TM contained in the above-mentioned some dynamic RAM's becomes different from the timing at which the timing pulses $\phi_T$ are produced from the timer circuits TM contained in the remaining dynamic RAM's. However, since the external terminals RDY are commonly connected together as shown in FIG. 3, all of the dynamic RAM's perform the refresh operation in synchronism with each other, and the through-put of the memory system decreases very little.

The above-mentioned fact can also be adapted to a plurality of memory systems.

That is, the external terminals RDY are coupled together among the plurality of memory systems, and some memory systems among these memory systems are not always served with the power-source voltage $V_{CC}$ but are served with the power-source voltage $V_{CC}$ only at required moments.

As described above, the dynamic RAM of this embodiment has two refresh operation modes.

In the first operation mode, the refresh operation is effected periodically for the memory cells, and a busy signal $\overline{RDY}$ is produced from the dynamic RAM as long as the refresh operation is being effected. Therefore, no circuit is required to produce an external signal which energizes the dynamic RAM to perform refresh operation. Further, production of busy signal $\overline{RDY}$ makes it possible to easily distinguish the period in which the data can be read out from, or written onto, the dynamic RAM's over the period in which it is not allowed to write or read the data (in which refresh operation is being carried out). In effect, there is obtained a dynamic RAM that can be easily handled.

In the second operation mode, the refresh operation is effected in synchronism with the starting signal supplied from an external unit. Therefore, if the individual dynamic RAM's constituting the memory system are operated under the second operation mode and if the starting signal is commonly supplied thereto, the dynamic RAM's perform the refresh operation nearly simultaneously. This helps prevent the through-put of the memory system from decreasing strikingly.

In a memory system having a first dynamic RAM that substantially operates under the first operation mode and having a second dynamic RAM that substantially operates under the second operation mode, as described with reference to FIG. 3, the busy signal $\overline{RDY}$ formed by the first dynamic RAM serves as a starting signal for the second dynamic RAM. Therefore, the refresh operation of the first dynamic RAM and the refresh operation of the second dynamic RAM are performed in synchronism with each other, and the through-put of the memory system is prevented from decreasing. In this case, since the starting signal is formed by the dynamic RAM, no circuit is necessary to form the starting signal.

Further, the dynamic RAM's of the above-mentioned embodiment are based upon the internal synchronizing system to form a variety of timing signals necessary for the operation upon detection of change in the address signals. Therefore, although they form busy signals $\overline{RDY}$, the dynamic RAM's can be handled in the same manner as static RAM's, i.e., handled easily. In other words, like a memory system consisting static RAM's, the memory system shown in FIG. 3 does not require any particular timing signals, and can be handled very easily.

The dynamic RAM of the above embodiment does not permit the receipt of a starting signal until a predetermined period of time passes from the production of a busy signal. Concretely speaking, the gate circuit G1 is closed as long as the delay signal $\phi_{DL}$ produced by the delay circuit DL assumes the low level. This inhibits the starting signal supplied via the external terminal RDY from being transmitted to the refresh control circuit REFC. Therefore, the refresh operation is not initiated even when the starting signal (busy signal) is supplied from the dynamic RAM that has commenced the refresh operation delayed behind the others. This helps prevent the through-put of the memory system from decreasing. This also prevents the busy signal which is formed from being supplied again as a starting signal to the refresh control circuit REFC.

The foregoing has concretely described a preferred embodiment of the present invention. However, it should be noted that the present invention is in no way limited to the above-mentioned embodiment only but can be modified in a variety of other ways without departing from the gist thereof. A series of refresh operations (one turn of the refresh address counter) may be effected responsive to a starting signal from the timer circuit TM or from the external terminal RDY. In this case, an oscillation circuit should be newly provided to supply pulses that energize the counter to effect one turn of operation. If operation of the timer circuit TM is inhibited, it is possible to effect automatic refresh operation of the externally controlled type to control the refresh operation, responsive to a refresh control signal supplied to the external terminal RDY.

Moreover, the dynamic RAM may be constituted in a variety of forms such as address multiplex system or the like. Further, the memory array may produce a reference voltage for reading by using dummy cells.

The timer circuit TM needs not be reset by a reset signal which is produced by the refresh control circuit REFC. In this case, the timer circuit TM should produce a pulse after every predetermined period of time.

Further, the pull-up means may be provided in each of the dynamic RAM's. This makes it possible to easily form a ready signal RDY.

The refresh address counter may be counted up (or counted down) at a moment the refresh operation is completed.

When the memory system is to be constituted as shown in FIG. 3, furthermore, only one dynamic RAM may possess the timer circuit TM, and the other dynamic RAM's need not possess the timer circuit TM. In this case, for instance, the dynamic RAM $IC_{00}$ may have the automatic refresh circuit REF shown in FIG. 2 but with the inverters IV1, IV2, delay circuit DL, and gate circuits G1, G2 taken away, and each of the other dynamic RAM's may have the automatic refresh circuit REF shown in FIG. 2 but with the timer circuit TM and gate circuit G2 taken away. This makes it possible to reduce the cost of the dynamic RAM's, and accordingly to reduce the cost of the memory system without decreasing the through-put of the memory system.

Also, although only a single terminal RDY has been shown in FIG. 2 for both indicating the busy state and receiving a $\overline{RDY}$ signal from other RAM's, a two terminal arrangement could be provided, if desired, with the first terminal indicating the busy state and the second terminal receiving $\overline{RDY}$ signals from other RAM's.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor memory device comprising:
    a plurality of memory cells each of which has a capacitor for storing data;
    a select circuit for selecting a memory cell designated by first address signals out of said plurality of memory cells;
    an amplifier circuit which receives data stored in the capacitor of the selected memory cell, which amplifies the data, and which sends the amplified data back to the capacitor of said selected memory cell for rewriting the data in said selected memory cell;
    an external terminal;
    timing signal generating means which forms a first starting signal;
    refresh control means which receives said first starting signal and a second starting signal that is supplied via said external terminal, and which forms said first address signals and a busy signal that is to be supplied to said external terminal responsive to whichever of said first starting signal or said second starting signal is received first; and
    inhibit means which inhibits the supply of the second starting signal from said external terminal to said refresh control means for a predetermined period of time responsive to said busy signal,
    wherein the operation for rewriting the data into the memory cell is performed in accordance with either the first starting signal received by said refresh control means or a second starting signal supplied to said external terminal, and wherein the busy signal for indicating the rewriting operation is supplied to said external terminal in response to performing of the rewriting operation.

2. A semiconductor memory device as set forth in claim 1, wherein said timing signal generating means periodically forms said first starting signal, and wherein said refresh control means periodically produces said busy signal and said first address signals that are different from each other in accordance with either the first starting signal or the second starting signal, whereby the rewriting operation is effected for the individual memory cells.

3. A semiconductor memory device as set forth in claim 2, wherein said refresh control means forms a timing signal for resetting said timing signal generating means responsive to whichever of the first starting signal or the second starting signal is supplied first, so that said timing signal generating means does not begin a timing sequence for the production of said first starting signal.

4. A semiconductor memory device as set forth in claim 3, further comprising address buffer means which receives external address signals, and which forms second address signals, and a multiplexer which receives said first address signals and said second address signals to selectively transmit the signals of either one side to said select circuit, whereby a memory cell designated by the first address signals or the second address signals is selected out of said plurality of memory cells.

5. A semiconductor memory device as set forth in claim 4, wherein said amplifier circuit has a differential amplifier circuit which has a pair of input/output terminals, one or the other input/output terminal being connected to one electrode of the capacitor of a memory cell which is selected, and said one or the other input/output terminal being further provided with a reference potential.

6. A semiconductor memory device as set forth in claim 5, wherein each of the memory cells has a third input/output terminal, a select terminal, and an insulated gate field-effect transistor of which the gate is connected to said select terminal, and of which the drain-source path is connected across said third input-/output terminal and one electrode of the capacitor.

7. A semiconductor memory device as set forth in claim 6, wherein provision is further made of a first data line connected to the third input/output terminals of the plurality of memory cells and to one input/output terminal of said differential amplifier circuit, a second data line connected to the third input/output terminals of the plurality of memory cells and to the other input/output terminal of said differential amplifier, and a plurality of word lines connected to the select terminals of the individual memory cells, and wherein said select circuit has an output terminal which produces a select signal to the word line connected to the select terminal of a memory cell that is designated by the first address signals or the second address signals.

8. A semiconductor memory device as set forth in claim 7, further comprising a first switching means between said first data line and said second data line, and
   wherein said differential amplifier circuit comprises:
   a CMOS latching circuit that possesses said pair of input/output terminals, a first power-source terminal for receiving a first power-source voltage, and a second power-source terminal for receiving a second power-source voltage;
   a second switching means provided between said first power-source voltage and said first power-source terminal; and
   a third switching means provided between said second power-source voltage and said second power-source terminal, and
   wherein said second and third switching means are turned on when said first switching means is turned off.

9. A system comprising:
a first semiconductor memory device which comprises:
   a plurality of memory cells each of which has a capacitor to store data;
   a select circuit which selects a memory cell designated by the first address signals out of said plurality of memory cells;
   an amplifier circuit which receives data stored in the capacitor of the selected memory cell, which amplifies the data, and which transmits the amplified data back to the capacitor of said selected memory cell for rewriting the data in said selected memory cell;
   a first terminal; and
   a first control circuit which forms said first address signals as well as a first busy signal that is to be supplied to said first terminal; and
a second semiconductor memory device which comprises:
   a plurality of memory cells each of which has a capacitor to store data;
   a select circuit which selects a memory cell designated by the second address signals out of said plurality of memory cells;
   an amplifier circuit which receives data stored in the capacitor of the selected memory cell, which amplifies the data, and which transmits the amplified data back to the capacitor of said selected memory cell for rewriting the data in said selected memory cell;
   a second terminal; and
   a second control circuit which forms said second address signal upon receipt of said first busy signal via said second terminal,
   whereby the operation for rewriting the data onto the memory cells in the second semiconductor memory device is performed in synchronism with the operation for rewriting the data onto the memory cells in the first semiconductor memory device.

10. A system as set forth in claim 9, wherein said first control circuit periodically forms said first busy signal and said first address signals that are different from each other.

11. A system as set forth in claim 10, wherein said first control circuit has timing signal generating means which periodically forms a starting signal, and a first refresh control circuit which forms said first address signals and said first busy signal responsive to said starting signal.

12. A system comprising:
   a first semiconductor memory device which comprises:
   a plurality of memory cells each of which has a capacitor for storing data;
   a select circuit for selecting a memory cell designated by first address signals out of said plurality of memory cells;
   an amplifier circuit which receives data stored in the capacitor of the selected memory cell, which amplifies the data, and which sends the amplified data back to the capacitor of said selected memory cell for rewriting the data in said selected memory cell;
   an external terminal;
   timing signal generating means which forms a first starting signal;
   refresh control means which receives said first starting signal and a second starting signal that is supplied via said external terminal, and which forms said first address signals and a busy signal that is to be supplied to said external terminal responsive to whichever one of said first starting signal or said second starting signal is received earlier; and
   inhibit means which inhibits the supply of said second starting signal from said external terminal to said refresh control means for a predetermined period of time responsive to said busy signal;
   a second semiconductor memory device that is constructed in the same manner as said first semiconductor memory device; and
   wiring means for coupling the external terminal of said first semiconductor memory device to the external terminal of said second semiconductor memory device,
   whereby the operation for rewriting the data into the memory cells in the first semiconductor memory device is performed in synchronism with the operation for rewriting the data into the memory cells in the second semiconductor memory device.

13. A system as set forth in claim 12, wherein said timing signal generating means periodically forms said first starting signal,
   whereby the operation for rewriting the data into the memory cells in the first and second semiconductor memory devices is periodically performed.

14. A system as set forth in claim 13, wherein said refresh control means forms a timing signal that resets said timing signal generating means responsive to whichever of said first starting signal or said second starting signal is received earlier, so that said timing signal generating means does not begin a timing sequence for the production of said first starting signal.

15. A system as set forth in claim 14, further comprising a load means connected between said external terminal of said first semiconductor memory device and a first voltage terminal for being supplied with a first potential, and wherein said refresh control means comprises an insulated gate field-effect transistor of which the source-drain path is coupled between said external terminal and a second voltage terminal for being supplied with a second potential and which is turned on when the busy signal is produced.

16. A system as set forth in claim 15, wherein each of said first and second semiconductor memory devices further comprises address buffer means which receives external address signals and which forms second address signals, and a multiplexer which receives said first address signals and said second address signals to selectively transmit either the first or second address signals to said select circuit in accordance with a control signal provided by said refresh control means, so that the memory cell designated by the first address signals or the second address signals is selected out of said plurality of memory cells in accordance with the selection of said multiplexer.

* * * * *